(12) United States Patent
Brodsky et al.

(10) Patent No.: US 6,731,012 B1
(45) Date of Patent: May 4, 2004

(54) NON-PLANAR SURFACE FOR SEMICONDUCTOR CHIPS

(75) Inventors: William L. Brodsky, Binghamton, NY (US); Sanjeev B. Sathe, Binghamton, NY (US); George H. Thiel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,679

(22) Filed: Dec. 23, 1999

(51) Int. Cl.[7] .......................... H01L 23/48; H01L 23/12
(52) U.S. Cl. .................. 257/778; 257/678; 257/737; 257/738; 257/711; 257/712
(58) Field of Search .................. 257/711, 679, 257/688, 678, 706–707, 712–713, 717–720, 737–738, 778, 782, 787

(56) References Cited

U.S. PATENT DOCUMENTS

| | | | |
|---|---|---|---|
| 4,670,770 A | * | 6/1987 | Tai |
| 5,731,222 A | | 3/1998 | Malloy et al. ............... 437/182 |
| 5,760,465 A | | 6/1998 | Alcoe et al. ................. 257/669 |
| 5,770,884 A | | 6/1998 | Pogge et al. ................. 257/506 |
| 5,998,875 A | * | 12/1999 | Bodo et al. |
| 6,049,124 A | * | 4/2000 | Raiser et al. ............... 257/712 |
| 6,118,178 A | * | 9/2000 | Takeuchi |

FOREIGN PATENT DOCUMENTS

| | | |
|---|---|---|
| EP | 0 840 332 A2 | 5/1998 |
| EP | 97 11 8837 | 2/2000 |
| GB | 0 174 539 A | 11/1986 |
| JP | 2-155231 | 6/1990 |
| JP | 3-241856 | 10/1991 |
| JP | 4-253359 | 9/1992 |
| JP | 5-36825 | 12/1993 |
| JP | 2001015558 A | * 7/1999 |
| JP | 4-317355 | 11/1999 |

OTHER PUBLICATIONS

"Process Considerations in the Fabrication of Teflon Printed Circuit Boards", by Light et al, 1994 Proceedings, 44 Electronic Components & Technology Conference, May 1994.

"High Performance Carrier Technology: Materials And Fabrication", By Light et al, 1993 International Electronics Packaging Conference, San Diego, California, vol. one.

"High Performance Carrier Technology", by Heck et al, 1993 International Electronics Packaging Conference, San Diego, California, vol. one.

* cited by examiner

*Primary Examiner*—Long Pham
*Assistant Examiner*—Dilinh Nguyen
(74) *Attorney, Agent, or Firm*—Schmeiser, Olsen & Watts; William H. Steinberg (57) ABSTRACT

A semiconductor chip package having a non-planar chip therein, to reduce the stress concentrations between the chip and cover plate. In particular, a chip and method of forming a chip having a non-planar or "domed" back surface, wherein the thickness of the non-planar chip is greatest substantially near the center of the chip. Further, a method of rounding the edges or corners of the chip to reduce crack propagation originating at the edges of the chip.

17 Claims, 9 Drawing Sheets

NON-PLANAR SURFACE FOR SEMICONDUCTOR CHIPS

BACKGROUND OF THE INVENTION

1. Technical Field

The present invention relates generally to semiconductor chip packaging. More particularly, the present invention relates to a non-planar semiconductor chip, and a method of forming the non-planar semiconductor chip.

1. Related Art

In the manufacture of semiconductor chip packages, such as laminate chip carriers, differences in the coefficients of thermal expansion, in combination with thermal cycling, tend to produce high stresses in locations of abrupt geometric change within the chip. During thermal cycling the chip may bend creating a stress concentration between the outer edges of the chip and the package cover plate, heat sink, or other device mounted thereon, as well as the adhesive materials therebetween. In addition, high localized stresses tend to occur at the edges of organic chip carrier packages, having heat spreaders or coupled caps, due to the differences in curvature of the various layers. Further, flaws, such as voids, cracks, etc., within the edges or corners of the chip may lead to crack propagation, particularly in locations of abrupt geometric change. As a result, chips may become cracked and/or delamination may occur between the chip, cover plate, and the adhesive material therebetween.

Attempts have been made in the industry to minimize the amount of stress concentrations within the chip packages. For instance, the thickness of the chip has been reduced in an attempt to make the chip more flexible, thereby minimizing the stress concentrations. The thickness of the cover plate or heat sink has been reduced near the edges of the cover plate or heat sink in an attempt to increase flexibility as well. Additionally, attempts have been made to minimize the amount of thermal mismatch between the chip, cover plate or heat sink and the adhesives in contact with the chip.

Accordingly, there currently exists a need in the industry for a semiconductor chip package having reduced stress concentrations therein.

SUMMARY OF THE INVENTION

The present invention provides a non-planar semiconductor chip which reduces the stress concentrations produced within semiconductor chip packages, e.g., at the outer edges of the chip-cap interface, within the adhesive material, etc. The present invention further provides a method of making a semiconductor chip package having a non-planar chip therein.

The first general aspect of the present invention provides an electronic package comprising: an electronic component having a first surface electrically mounted to a substrate and a second arcuate surface having a contour such that the distance between the first surface and the second arcuate surface is greatest substantially near the center of the electronic component. This aspect provides an electronic package having a chip with a non-planar or domed surface which reduces the stress concentrations located at the edges of the electronic package. This aspect further reduces the amount of cracking and delamination that typically occurs within the electronic package, particularly at the edges due to thermal cycling.

The second aspect of the present invention provides a method of forming an electronic package, comprising the steps of: providing an electronic component having a first featurized surface and a second surface; and removing a portion of the second surface such that the second surface is substantially arcuate, having a thickness greatest substantially near the center of the electronic component. This aspect provides similar advantages as those associated with the first general aspect.

The third general aspect of the present invention provides a method of forming a chip, comprising the steps of: providing an electronic component having a first featurized surface and a second planar surface; removing a first portion of the second planar surface forming a first arcuate surface; and removing a second portion of the second planar surface forming a second arcuate surface. This aspect provides similar advantages as those associated with the first general aspect.

The fourth general aspect provides a semiconductor chip having a substantially planar first surface and an arcuate second surface. This aspect provides similar advantages as those associated with the first general aspect.

The fifth general aspect provides a method of forming an electronic package, comprising the steps of: providing an electronic component; and profiling at least one edge of the component. This aspect allows for an electronic component having at least one radiused or profiled edge therein. This provides for the removal of voids, chips or other small defects found at the edges of the chip due to scoring and dicing operations.

The sixth aspect provides an electronic component having at least one substantially planar surface and at least one profiled edge. This aspect provides similar advantages as those associated with the fifth aspect.

The seventh aspect provides an electronic package, comprising: at least one electronic component, having at least one non-planar surface. This aspect provides a chip having either the advantages associated with the domed back surface of the first aspect, or the advantages associated with the radiused edges of the fifth aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
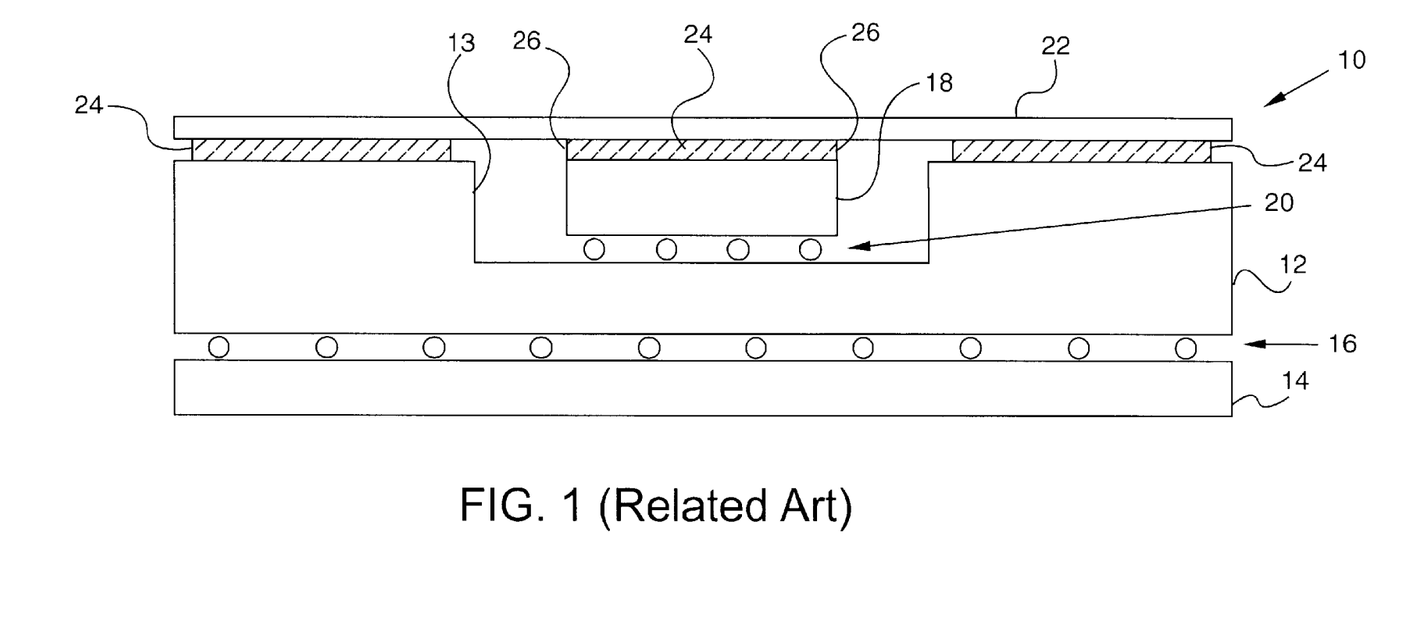
FIG. 1 depicts a cross-sectional view of a related art semiconductor chip package.

Referring to the drawings, FIG. 1 shows a cross-sectional view of a related art semiconductor chip package 10. A carrier 12 is connected to a card or substrate 14 by a plurality of connectors 16. The carrier includes an opening 13 to house a semiconductor chip 18. The chip 18 is electrically connected to the carrier 12 by a plurality of connectors 20. A cover plate 22 is mounted on the carrier 12 and the chip 18 by an adhesive 24. Unfortunately, due to differences in the coefficients of thermal expansion between the chip 18, the cover plate 22 and the adhesive 24, in conjunction with thermal cycling, etc., stress concentrations occur within the chip 18 as a result of geometric changes that take place within the chip package 10. As a result, the chip 18 may begin to pull away from the cover plate 22 at the edges 26, as well as the adhesive 24 therebetween, resulting in delamination of the chip 18.

Figure 2:
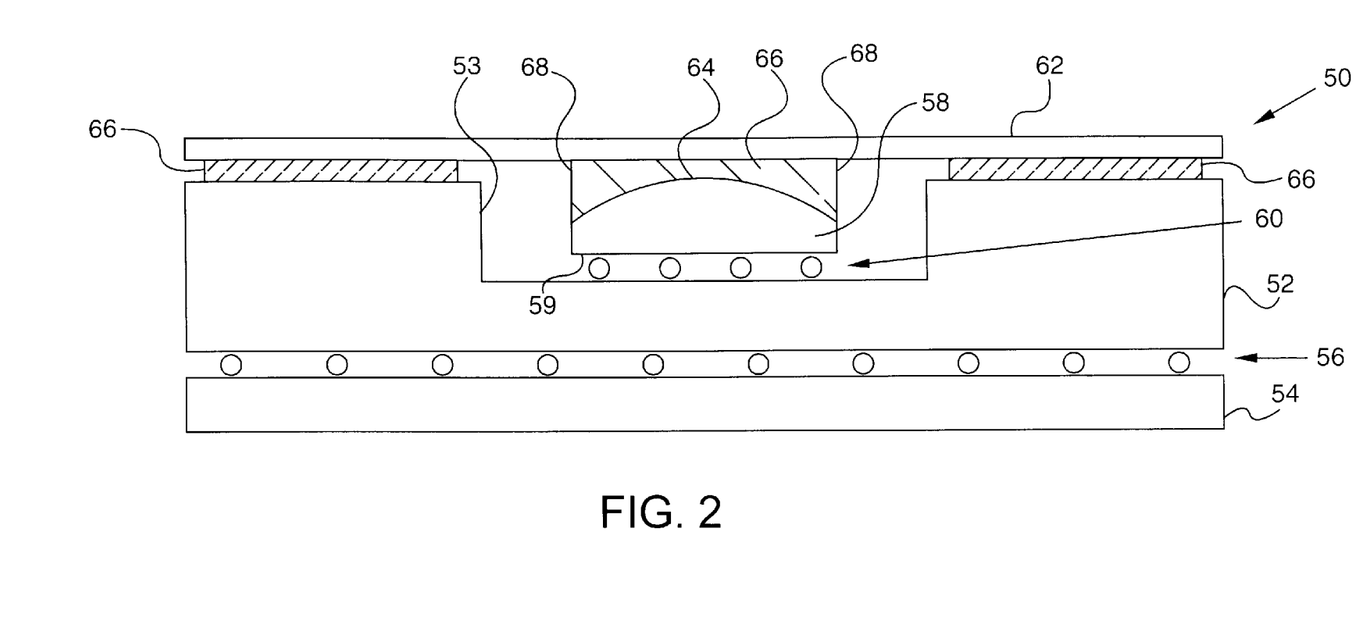
FIG. 2 depicts a cross-sectional view of a semiconductor chip package in accordance with a preferred embodiment of the present invention.

FIG. 2 illustrates a cross-sectional view of a semiconductor chip package 50 in accordance with the present invention. The semiconductor chip package 50 generally includes a carrier 52 having an opening 53 therein. The carrier 52 is electrically connected to a card or substrate 54, such as a circuit board, by a plurality of connectors 56, e.g., ball grid array (BGA), column grid array, grid array, etc. A circuitized or featurized surface 59 of a semiconductor chip 58 is electrically connected to the carrier 52 within the opening 53 by a plurality of connectors 60, e.g., controlled collapse chip connectors (C4). The chip 58 includes a non-planar arcuate or domed back surface 64. A planar element 62, such as a cap, cover plate, heat sink, etc., is mounted on the carrier 52 and the chip 58 by an adhesive 66. The adhesive is preferably a thermally conductive reflowable bonding material known and used in the industry. Due to the configuration of the chip 58, namely, the non-planar or "domed" shape, the thickness of the adhesive 66 is greatest near the edges 68 of the chip 58. This allows for bending of the chip 58, that occurs during thermal cycling, without causing the chip 58 to pull away from, or curl towards the planar element 62 at the edges resulting in delamination and/or stress concentrations at the edges of the chip 58. Therefore, the life of the chip and the electronic package is significantly increased, with little or no added expense in manufacture.

Despite the use of a non-planar chip, the finished semiconductor chip package 50 illustrated in FIG. 2, remains substantially planar. The use of a non-planar chip 58 does not alter the shape of the finished semiconductor package 50. This is helpful because it is desirable for the planar element 62 (depicted in FIG. 2) to be flat for the subsequent mounting of heat sinks, heat spreaders, etc., which require a planar mounting surface.

Figure 3:
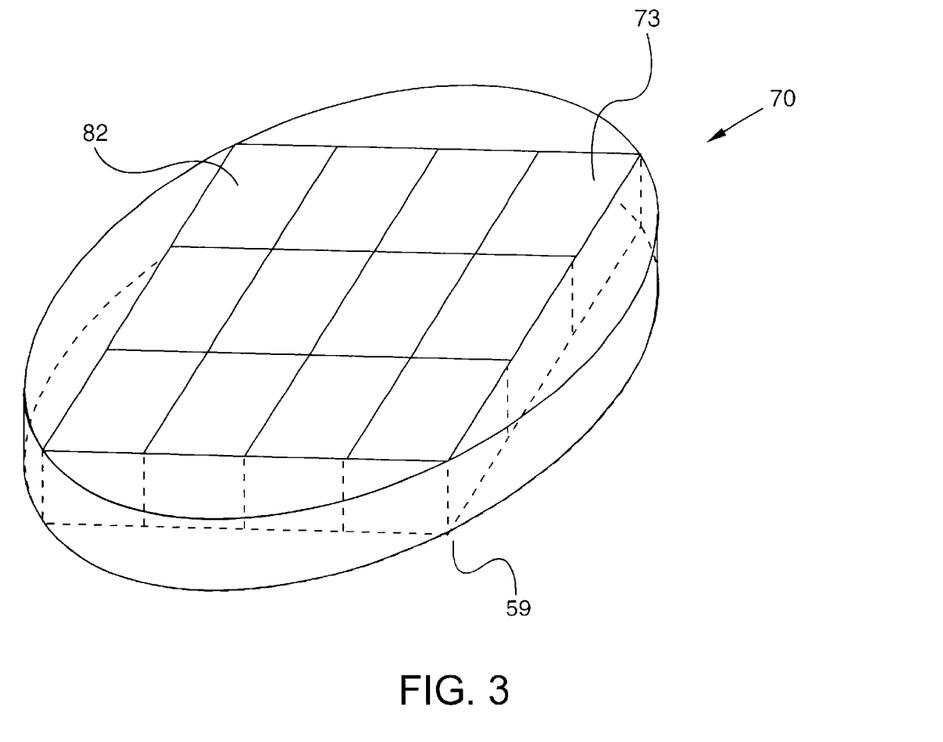
FIG. 3 depicts a semiconductor wafer in accordance with a first embodiment of the present invention.
Figure 4:
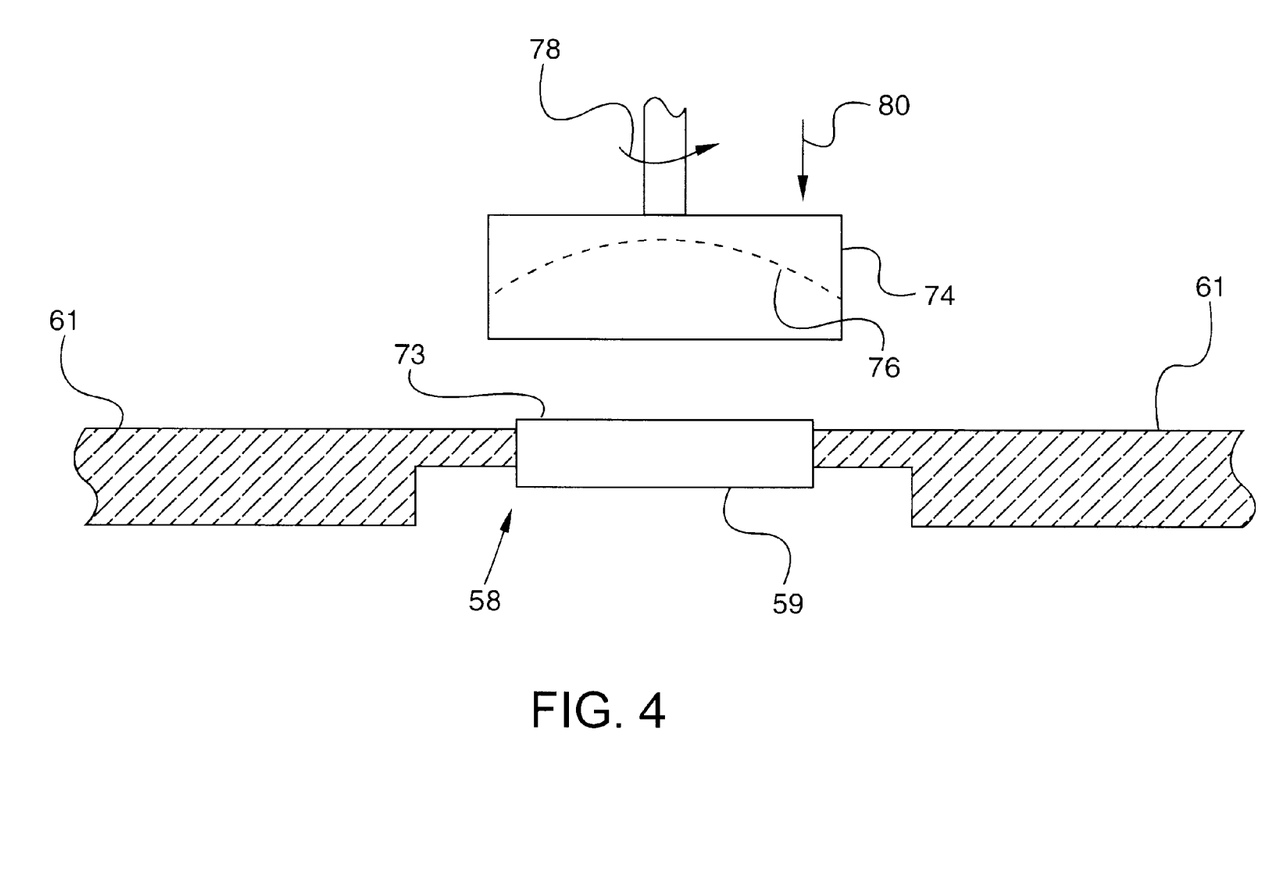
FIG. 4 depicts a chip and a profiling tool in accordance with the first embodiment of the present invention.
Figure 5:
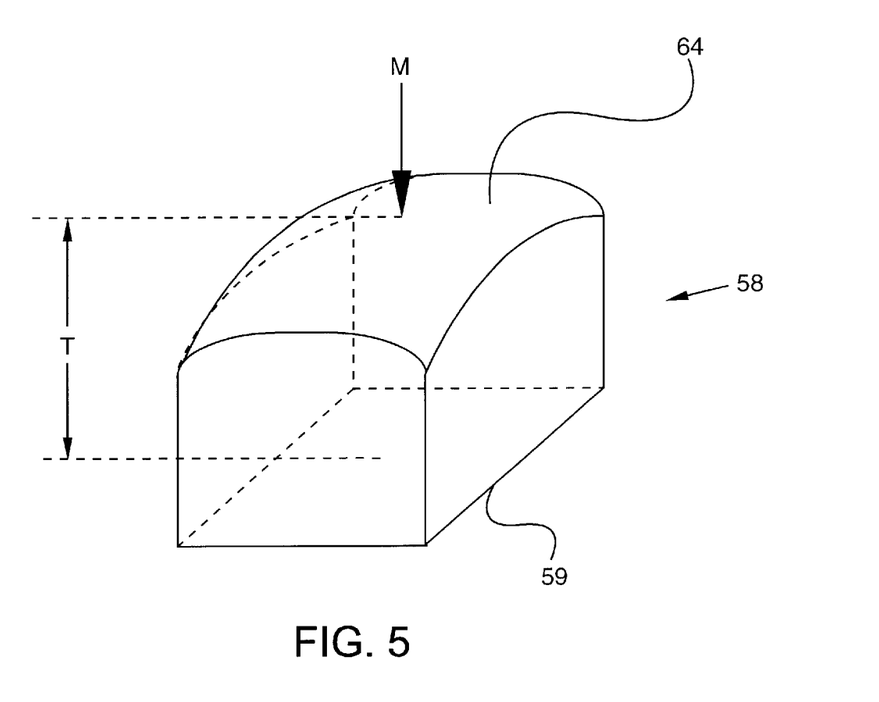
FIG. 5 depicts a profiled chip in accordance with a preferred embodiment of the present invention.

In a first embodiment of the present invention, FIG. 3 depicts a wafer 70 having a first circuitized or featurized surface 59 and a planar second or back surface 73. The featurized surface 59 is circuitized in sections 82 of the wafer 70, such that each section 82 corresponds to the location of a chip 58 (depicted in FIG. 2). The wafer is scored and diced, using a process known in the art, to form individual chips 58, as shown in FIG. 4. Each chip 58 is securely held by a part holder 61, i.e., a chuck, vice, etc., as known in the art, and back side ground using a profiling tool 74, e.g., a cup grinding wheel, an abrasive impregnated convex surface, etc. Specifically, the concave grinding surface 76 of the profiling tool 74, rotating in the direction indicted by arrow 78, descends (in the direction indicted by arrow 80) upon the back surface 73 of the chip 58, thereby removing a portion of the back surface 73 of the chip 58. A profiled chip 58 is produced having a domed back surface 64, as depicted in FIG. 5. The thickness T of the chip 58 is preferably greatest near the center or midpoint M of the chip 58. The featurized surface 59 of the chip 58 remains undefiled and ready for electrical connection. The modified chip 58 may then be electrically mounted within the chip package 50, as described above and illustrated in FIG. 2.

In the alternative, the wafer 70 may be scored and each section 82 of the wafer 70 may be profiled using the profiling tool 74 before the wafer 70 is diced into individual chips 58. Further, the wafer 70 may be ground, scored and profiled using a profiling tool 74 having an inner grinding surface 76 that only accommodates the profiling of one section 82 of the wafer 70 at a time, as described above. A single profiling tool 74 may also be used having an inner grinding surface 76 capable of grinding, scoring and profiling the entire wafer 70, or a plurality of sections 82 at once.

Figure 6:
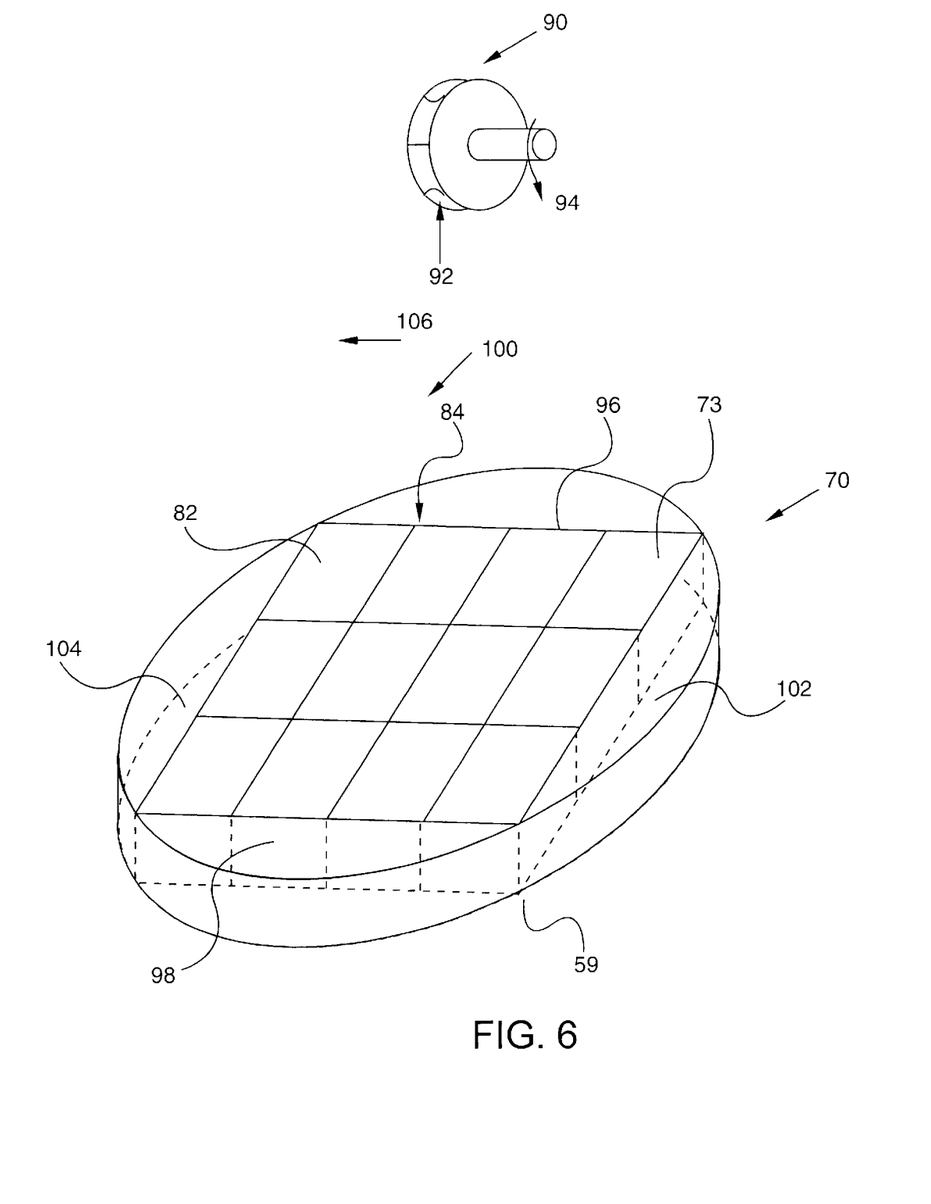
FIG. 6 depicts a semiconductor wafer and profiling tool in accordance with a second embodiment of the present invention.
Figure 7:
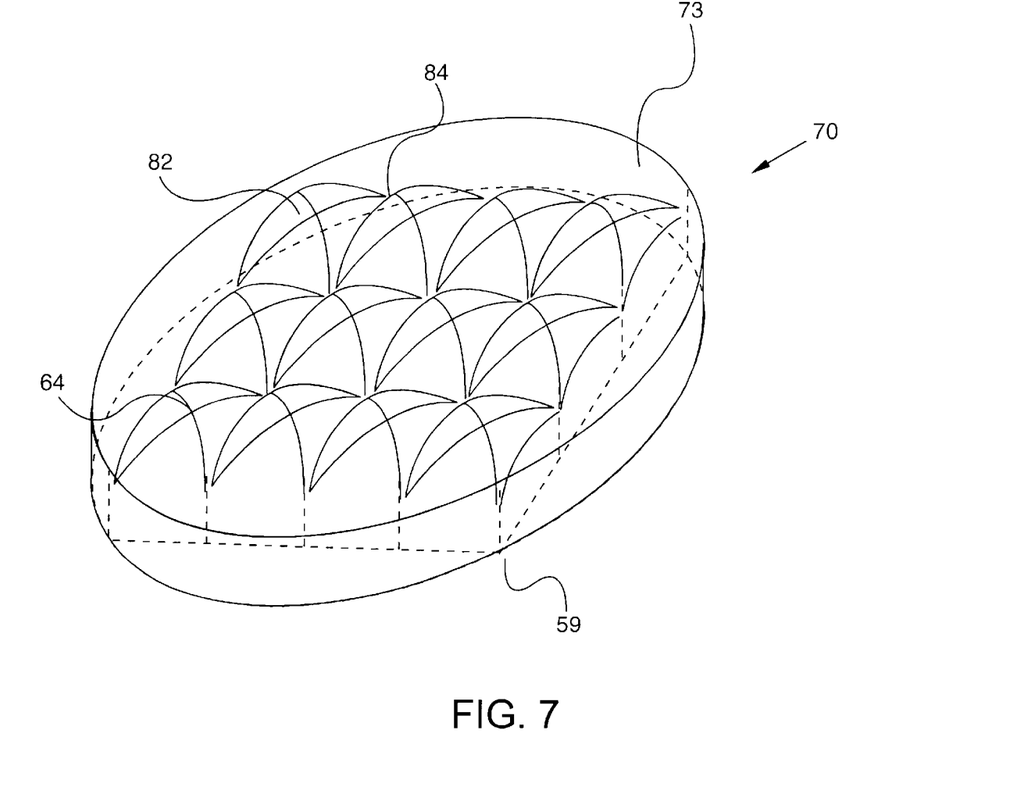
FIG. 7 depicts a profiled semiconductor wafer in accordance with the second embodiment of the present invention.

In a second embodiment of the present invention, the wafer 70 as a whole may be profiled using a profiling tool 90, as illustrated in FIG. 6. The profiling tool 90, having a concave inner grinding surface 92, rotating in the direction indicated by arrow 94, passes over each section 82 of the wafer 70 in two directions. First the profiling tool 90 passes over each section 82 of the wafer 70 from the back 96 of the wafer 70 to the front 98 of the wafer 70, as indicated by arrow 100. The profiling tool 90 then passes over each section 82 of the wafer 70 from the right side 102 of the wafer 70 to the left side 104 of the wafer 70, as indicated by arrow 106. FIG. 7 shows the wafer 70 produced, wherein each section 82 of the wafer 70 has a non-planar domed back surface 64. The wafer 70 is then diced along score lines 84, using techniques well known in the art, forming individual chips 58 having domed back surfaces 64, as shown in FIG. 5. The individual chips 58 may then be mounted in a chip package 50, as depicted in FIG. 2.

The second embodiment is not limited by the above description. For instance, multiple profiling tools 90 may be used having different concave inner grinding surfaces 92. In particular, the first pass over sections 82 of the wafer 70, in the direction indicated by arrow 100, may be performed using a profiling tool 90 having a first concave inner grinding surface 92, while the second pass, in the direction indicated by arrow 106, may use a profiling tool 90 having a second concave inner grinding surface 92.

It should be appreciated that the first and second embodiments described above may be modified by those skilled in the art, without departing from the scope of the present invention. For instance, one or more sides of the chip 58 or wafer 70 may be profiled to form a domed surface 64, in addition to, or in place of forming the domed back surface 64. In other words, the present invention is not limited to forming a domed surface 64 on the back surface 73, opposite the featurized surface 59.

Figure 8:
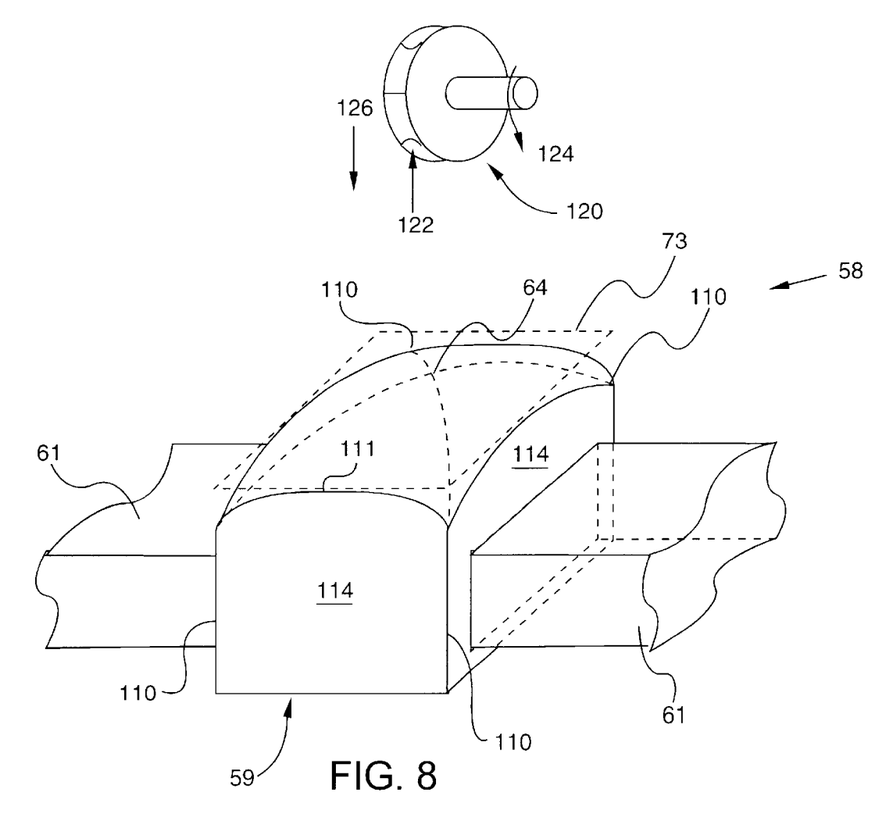
FIG. 8 depicts a chip in accordance with a third embodiment of the present invention.

A third embodiment of the present invention provides for the optional profiling of one or more edges 110, 111 of the chip 58. As illustrated in FIG. 8, the edges 110 in this example refer to the location where the sides 114 of the chip 58 meet. Likewise, the edges 111 refer to the location where the surfaces 59, 64, or 73 meet the sides 114 of the chip 58. Each chip 58 is held by a part holder 61, i.e., a chuck, vice, etc., as known in the art. A profiling tool 120, (similar to the profiling tool 90 shown in FIG. 6), having a concave inner grinding surface 122, rotating in the direction indicated by arrow 124, descends in the direction indicated by arrow 126 along one or more of the edges 110 of the chip 58. In a similar manner, the profiling tool 120 may then optionally be used to profile the edges 111 if so desired or needed.

Figure 9:
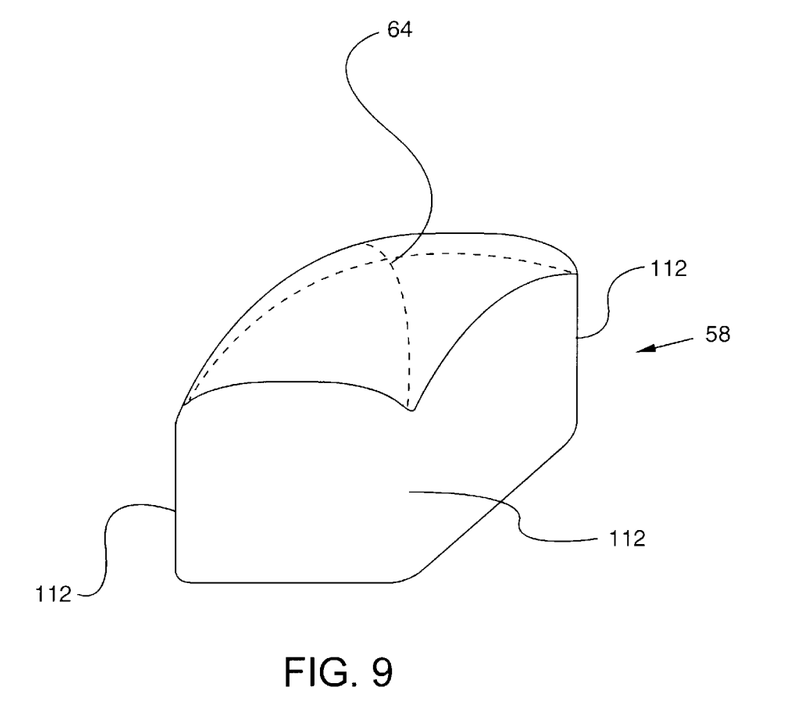
FIG. 9 depicts a modified chip in accordance with the third embodiment of the present invention.

FIG. 9 shows the chip 58 having radiused edges 112 produced as a result of profiling the edges 110. The rounded or radiused edges 112 help to eliminate flaws and stress concentrations often found at the edges 110, 111 of the chip 58. In particular, radiusing the edges 110 of the chip 58 will remove voids, chips and other small defects created at the edges 110, 111 of the chip 58 during scoring and dicing operations.

The third embodiment was illustrated in FIG. 8 using the chip 58, having a domed back surface 64, preferably formed using one of the techniques described above. However, it should be understood that this is only an example. This embodiment may be used in conjunction with, or completely independent of, the first and/or second embodiments. In other words, the technique described herein for forming radiused edges 112 may be used in conjunction with any type of chip, and is not restricted to use with the chip 58 having a domed surface 64.

It should be noted that the shape of the chip 58 used as an illustration dictates the location of the edges 110, 111. Since the present invention may be used for any variety of chip configurations, e.g., cylinders, discs, hemispheres, polygons, etc., the number and location of the edges 110, 111 will also vary accordingly, and are not limited by this disclosure.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. An electronic package comprising:
an electronic component having a first surface electrically mounted to a substrate and a second arcuate surface opposing the first surface and having a contour such that the distance between the first surface and the second arcuate surface continuously increases from a periphery of the electronic component to near the center of the electronic component.

2. The electronic package of claim 1, wherein a planar element is mounted to the second arcuate surface of the electronic component by an adhesive.

3. The electronic package of claim 2, wherein the adhesive is a thermally conductive reflowable material.

4. The electronic package of claim 1, wherein a planar element is mounted to the second arcuate surface of the electronic component is a cover plate.

5. The electronic package of claim 1, wherein a planar element is mounted to the second arcuate surface of the electronic component is a heat sink.

6. The electronic package of claim 1, wherein the second arcuate surface of the electronic component is contoured using a profiling tool having a concave profiling surface.

7. The electronic package of claim 1, wherein the electronic component has at least one profiled edge.

8. The electronic package of claim 1, wherein the second arcuate surface substantially continuously increases from a periphery of the electronic component to near the center of the electronic component.

9. A semiconductor chip comprising:
an electronic component having a substantially planar first surface and an opposed non-planar second surface, wherein the distance between the first surface and the second arcuate surface continuously increases from a periphery of the electronic component to near the center of the electronic component.

10. The semiconductor chip of claim 9, wherein the substantially planar first surface is electrically mounted to a substrate.

11. The semiconductor chip of claim 9, wherein the non-planar second surface is mounted to a planar element using a thermally conductive reflowable adhesive.

12. The semiconductor chip of claim 11, wherein the planar element is a cover plate.

13. The semiconductor chip of claim 11, wherein the planar element is a cover plate.

14. The semiconductor chip of claim 9, wherein tile electronic component has at least one profiled edge between the first surface and the second arcuate surface.

15. The semiconductor chip of claim 9, wherein the distance between the first surface and the second surface substantially continuously increases from a periphery of the electronic component to near the center of the electronic component.

16. An electronic package, comprising:
substrate having an opening therein; and
at least one electronic component mounted within the opening of the substrate, the electronic component having a non-planar first surface mid a second arcuate surface opposing the first surface and having a contour such that the distance between the first surface and the second arcuate surface continuously increases from a periphery of the electronic component to near the center of the electronic component.

17. The electronic package of claim 16, wherein the non-planar first surface of the electronic component is formed by profiling at least one surface of the component.

* * * * *